(12) United States Patent  (10) Patent No.: US 8,638,629 B2
Kim et al.  (45) Date of Patent: Jan. 28, 2014

(54) REFRESH CONTROL CIRCUIT, MEMORY APPARATUS AND REFRESH CONTROL METHOD USING THE SAME

(75) Inventors: Sang Hui Kim, Ichon-si (KR); Ju Young Seo, Ichon-si (KR)

(73) Assignee: SK Hynix Inc., Gyeonggi-do (KR)

( * ) Notice: Subject to any disclaimer, the term of this patent is extended or adjusted under 35 U.S.C. 154(b) by 181 days.

(21) Appl. No.: 13/181,997

(22) Filed: Jul. 13, 2011

(65) Prior Publication Data

US 2012/0176853 A1   Jul. 12, 2012

(30) Foreign Application Priority Data

Jan. 11, 2011   (KR) .................. 10-2011-0002654

(51) Int. Cl.
*G11C 7/00*   (2006.01)
(52) U.S. Cl.
USPC ................. 365/222; 365/233.18; 365/233.13; 365/230.01; 365/149

(58) Field of Classification Search
USPC ........... 365/222, 233.18, 233.13, 230.01, 149
See application file for complete search history.

(56) References Cited

U.S. PATENT DOCUMENTS

| 2008/0056046 A1* | 3/2008 | Oh ............................... 365/222 |
| 2009/0091997 A1* | 4/2009 | Miki et al. .................... 365/222 |
| 2009/0147608 A1* | 6/2009 | Klein ............................ 365/222 |

FOREIGN PATENT DOCUMENTS

| KR | 1020080030470 A | 4/2008 |
| KR | 1020100030868 A | 3/2010 |

* cited by examiner

*Primary Examiner* — Vu Le
*Assistant Examiner* — Han Yang
(74) *Attorney, Agent, or Firm* — William Park & Associates Patent Ltd.

(57) ABSTRACT

A memory apparatus is configured to generate refresh addresses with different values in response to one refresh command and an address, and perform a plurality of refresh operations with time differences in response to the refresh addresses. Herein, the refresh operations are performed within a refresh row cycle time.

23 Claims, 9 Drawing Sheets

FIG.10
<4 Piled & Two Refresh Operations>

REFRESH CONTROL CIRCUIT, MEMORY APPARATUS AND REFRESH CONTROL METHOD USING THE SAME

CROSS-REFERENCE TO RELATED APPLICATION

The present application claims priority to Korean Patent Application No. 10-2011-0002654, filed on Jan. 11, 2011, in the Korean Intellectual Property Office, which is incorporated herein by reference in its entirety as if set forth in full.

BACKGROUND

1. Technical Field

Various embodiments of the present invention relate to semiconductor circuits and related methods thereof. In particular, certain embodiments relate to a refresh control circuit, a memory is apparatus including such refresh control circuit, and a refresh control method using the same.

2. Related Art

A memory apparatus such as a dynamic random access memory (DRAM) apparatus loses data written in its memory cell with the lapse of time due to its structural characteristics. That is, the voltage level of a cell capacitor of the memory apparatus changes.

Therefore a refresh operation must be performed in such a DRAM apparatus to retain the written data, whereby the value of data stored in a memory cell periodically read and restored to its original level.

Figure 1:
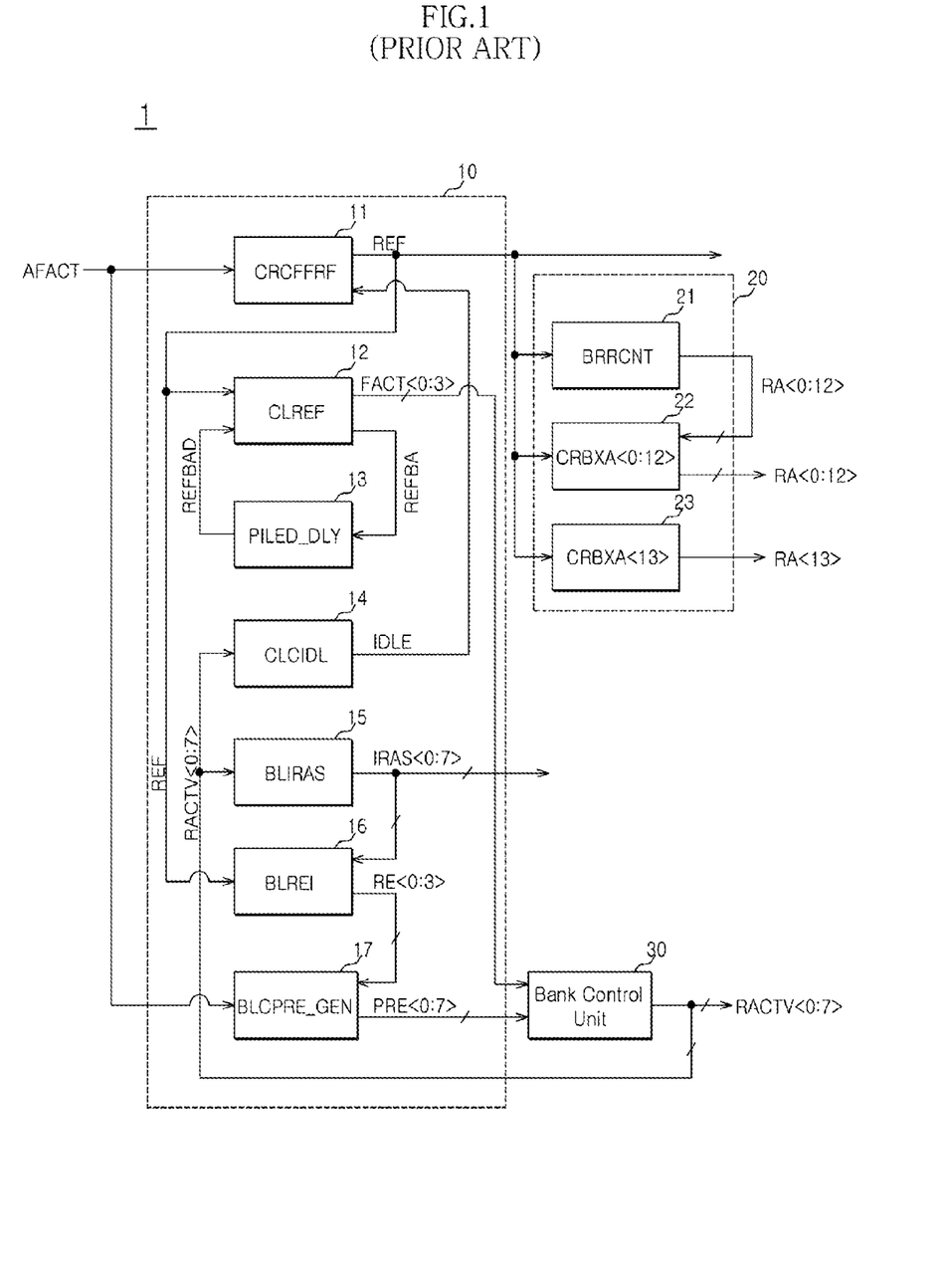
FIG. 1 is a block diagram of a conventional refresh control circuit in a DRAM apparatus.

FIG. 1 is a block diagram of a conventional refresh control circuit 1 in a DRAM apparatus.

As exemplarily illustrated in FIG. 1, a typical refresh control circuit 1 may include a refresh timing control unit 10, an address control unit 20, and a bank control unit 30.

The refresh timing control unit 10 is configured to generate refresh timing signals for determining the timing of a refresh operation in response to an external refresh command AFACT.

The refresh timing signals comprise a refresh period signal REF, an internal refresh command FACT<0:3>, a row access strobe signal IRAS<0:7>, and a precharge signal PRE<0:7>.

The refresh timing control unit 10 includes a plurality of logic circuit units 11 to 17.

The address control unit 20 is configured to generate a is refresh address RA<0:13> in response to the refresh period signal REF.

The address control unit 20 includes a plurality of logic circuit units 21 to 23.

The bank control unit 30 is configured to generate a row active signal RACTV<0:7> in response to the internal refresh command FACT<0:3> and the precharge signal PRE<0:7>.

Figure 2:
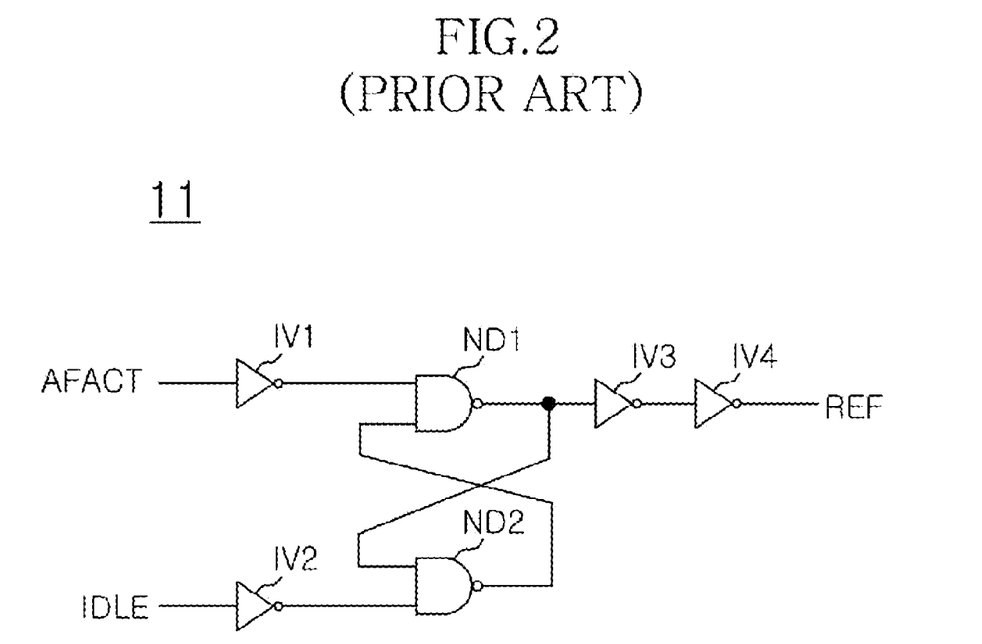
FIG. 2 is an exemplary circuit diagram of a logic circuit unit is illustrated in FIG. 1.

FIG. 2 is an exemplary circuit diagram of the first logic circuit unit 11 illustrated in FIG. 1.

As shown exemplarily in FIG. 2, the first logic circuit unit 11 may include NAND gates ND1 and ND2 and inverters IV1 and IV2.

The first logic circuit unit 11 sets the refresh period signal REF to a logical high level in response to the external refresh command AFACT, and resets the refresh period signal REF to a logical low level in response to an idle signal IDLE.

Figure 3:
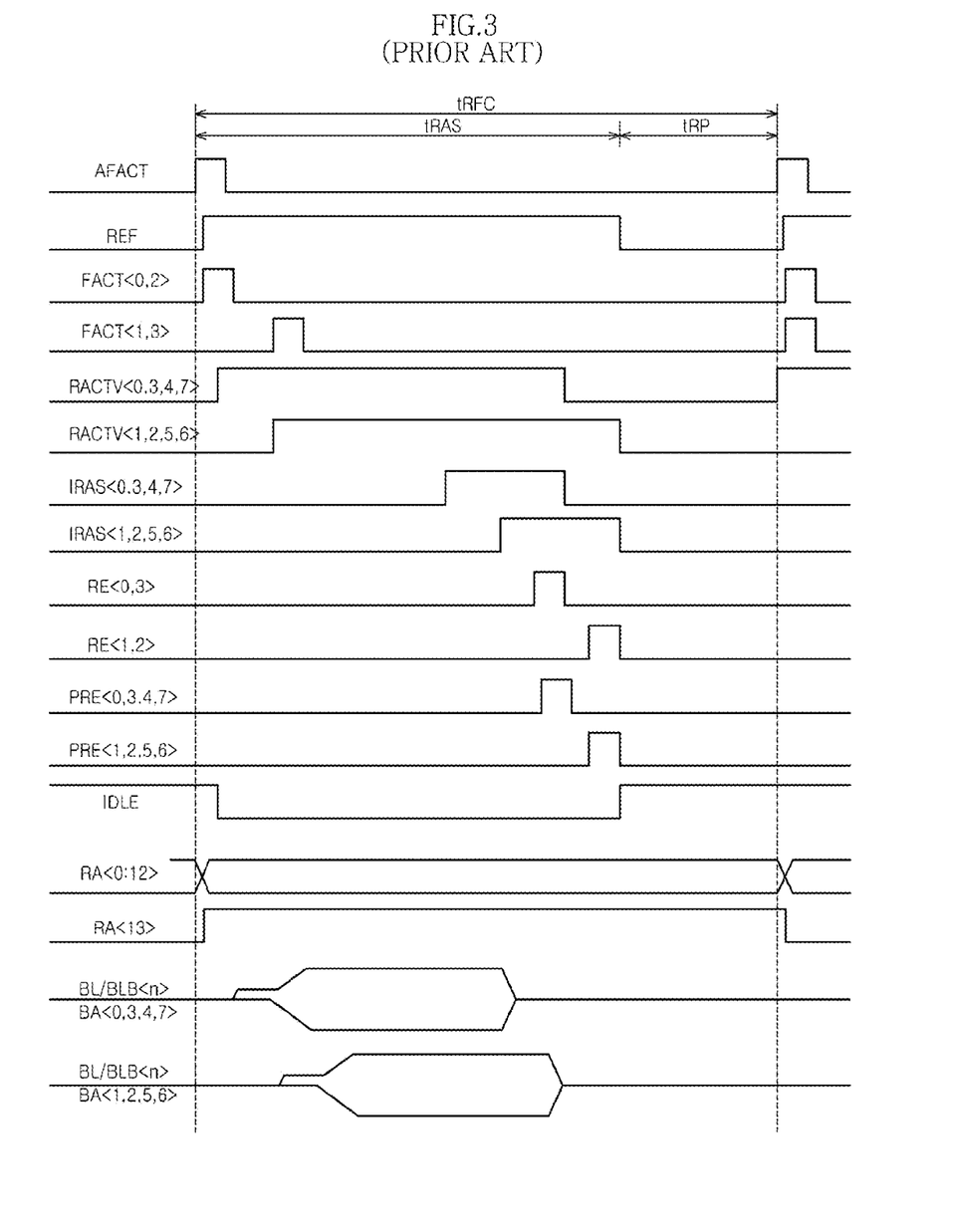
FIG. 3 is an operation timing diagram of the conventional refresh control circuit illustrated in FIG. 1.

FIG. 3 is a timing diagram illustrating an operation of the conventional refresh control circuit 1 illustrated in FIG. 1.

Referring to FIG. 3, the first logic circuit unit 11 generates the refresh period signal REF in response to the external refresh command AFACT and the idle signal IDLE.

The address control unit (CLCFFRF) 20 maintains the refresh address RA<13> at a predetermined logical level, for example, at a logical high level.

The second logic circuit unit (CLREF) 12 generates the internal refresh command FACT<0:3> in response to the refresh is period signal REF.

The third logic circuit unit (PILED_DLY) 13 delays an output signal REFBA of the second logic circuit unit 12 and generates a delay signal REFBAD.

The bank control unit 30 activates the row active signal RACTV<0:7> in response to the internal refresh command FACT<0:3>.

The fourth logic circuit unit 14 generates the idle signal IDLE by NORing the row active signal RACTV<0:7>.

The fifth logic circuit unit 15 generates the row access strobe signal IRAS<0:7> in response to the row active signal RACTV<0:7>.

The sixth logic circuit unit 16 generates a preliminary precharge signal RE<0:3> in response to the row access strobe signal IRAS<0:7> and the refresh period signal REF.

The seventh logic circuit unit 17 generates the precharge signal PRE<0:7> in response to the external refresh command AFACT and the preliminary precharge signal RE<0:3>.

The bank control unit 30 deactivates the row active signal RACTV<0:7> in response to the precharge signal PRE<0:7>.

Word lines of memory banks BA<0, 3, 4, 7> corresponding to the row active signals RACTV<0, 3, 4, 7> and the refresh addresses RA<0:13> are activated, and a charge sharing operation of a bit/bit-bar line BL/BLB<n> is performed accordingly.

According to the operation standards of a memory apparatus, a DRAM apparatus must perform a refresh operation 8K times per 64 msec.

Thus, if the conventional refresh control circuit 1 is designed to be suitable for a DRAM apparatus with a storage density of 4 G (Giga bytes), a row address is 16 bits. Therefore, 8 word lines must be activated in response to one external refresh command AFACT in order to refresh all the memory cells.

Here, a refresh row cycle time (tRFC) is one of the operation standards relevant to a refresh operation of the DRAM apparatus. The refresh row cycle time tRFC is equal to a row active time tRAS+a row precharge time tRP.

In the conventional method, when the external refresh command AFACT is inputted once, eight word lines (one word lines for each of the eight memory banks BA<0:7>) are activated for the refresh row cycle time tRFC with respect to the same refresh address RA<0:13>.

That is, four word lines of the memory banks BA<0, 3, 4, 7> are activated at the same time. Also, four word lines of the memory banks BA<1, 2, 5, 6> are activated at the same time.

The four word lines of the memory banks BA<0, 3, 4, 7> and the four word lines of the memory banks BA<1, 2, 5, 6> have substantially the same activation period with a slight time difference.

Meanwhile, the DRAM apparatus has a fuse set and a repair word line for repairing a defective word line.

Thus, because eight word lines corresponding to the same is row addresses A0 to A13 have substantially the same activation period by one external refresh command AFACT, the entire row region must be divided into 8 regions to perform a word line repair operation. This causes an increase in the number of repair-related circuits, that is, repair word lines and fuse sets.

As described above, according to the conventional method, the area efficiency of repair-related circuits decreases with an increase in the storage density of a memory apparatus, that is, the area of repair-related circuits increases with an increase in the number of fuse sets and repair word lines for a word line repair operation.

SUMMARY

Accordingly, there is a need for an improved repair control circuit, a memory apparatus with such repair control circuit, and a refresh control method using the same that may obviate one or more of the above-mentioned problems or disadvantages. In particular, there is a need for an improved repair control circuit capable of increasing the area efficiency of repair-related circuits, a memory apparatus, and a refresh control method using the same.

In the following description, certain aspects and embodiments will become evident. It should be understood that these aspects and embodiments are merely exemplary, and the invention, in its broadest sense, could be practiced without having one or more features of these aspects and embodiments.

To attain the advantages and in accordance with the purposes of the invention, as embodied and broadly described herein, one exemplary aspect of the present invention may provide a refresh control circuit which comprises: a refresh timing control unit configured to generate a burst refresh period signal, an internal refresh command, and a precharge signal in response to a refresh command; a bank control unit configured to generate a row active signal in response to the internal refresh command and the precharge signal; an address control unit configured to output a count signal as refresh addresses in response to the burst refresh period signal; and an address switching unit configured to generate the count signal in response to the burst refresh period signal.

In another exemplary aspect, the row active signal has a plurality of activation periods for a row cycle time.

In yet another exemplary aspect, the refresh addresses have different values corresponding to the plurality of activation periods.

In still another exemplary aspect, the address control unit is configured to output the count signal, instead of an external address, as refresh addresses in response to the burst refresh period signal.

In another exemplary aspect of the present invention, a memory apparatus is configured to generate refresh addresses with different values in response to one refresh command and an address, and perform a plurality of refresh operations with time differences in response to the refresh addresses, wherein the refresh operations are is performed within a refresh row cycle time tRFC.

In yet another exemplary aspect of the present invention, a refresh control method of a memory apparatus comprises: receiving a refresh command; generating a row active signal with a plurality of activation periods for a refresh row cycle time in response to the refresh command; and performing a refresh operation in response to the row active signal.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

DETAILED DESCRIPTION

Reference will now be made in detail to the exemplary embodiments consistent with the present disclosure, examples of which are illustrated in the accompanying drawings. Wherever possible, the same reference characters will be used throughout the drawings to refer to the same or like parts.

Before a detailed description of the exemplary embodiments of the present invention, an operational principle of the present invention is described in advance.

According to the operation standards of a memory apparatus such as a DRAM apparatus, a DRAM apparatus must is perform a refresh operation 8K times per 64 msec.

A refresh row cycle time (tRFC) is one of the operation standards relevant to a refresh operation of the DRAM apparatus. The refresh row cycle time tRFC is equal to a row active time tRAS+a row precharge time tRP.

In the conventional method, eight word lines have substantially the same activation period in response to on external refresh command AFACT, thus decreasing the area efficiency of repair-related circuit units.

Exemplary embodiments of the present invention perform a refresh operation (activation and precharge) on different word lines with a predetermined time difference within a refresh row cycle time (tRFC), thereby making it possible to increase the area efficiency of repair-related circuit units.

If a refresh row cycle time (tRFC) is 300 ns in a DRAM apparatus with a storage density of 4 G (Giga bytes), about 50 ns is sufficient to perform an activation and precharge operation.

Thus, a reference operation can be performed six times per a refresh row cycle time (tRFC). However, considering the power consumption by a refresh operation, exemplary embodiments of the present invention perform a refresh operation four times or two times per a refresh row cycle time (tRFC).

Figure 4:
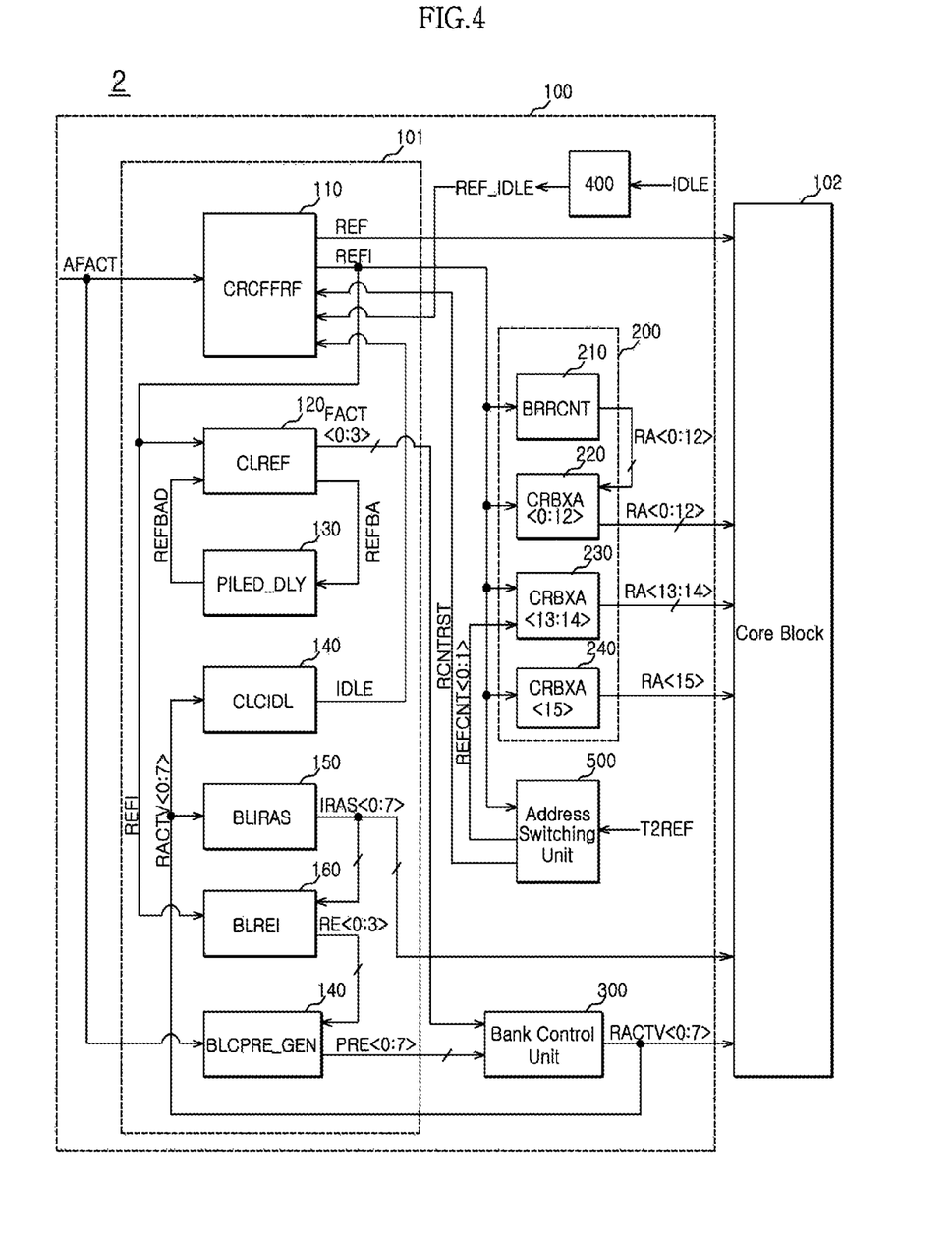
FIG. 4 is a block diagram of a memory apparatus according to an exemplary embodiment.

FIG. 4 is a block diagram of a memory apparatus according to one exemplary embodiment.

Referring to FIG. 4, a memory apparatus 2 according to one exemplary embodiment comprises a refresh control circuit 100 and a core block 102.

The core block 102 comprises memory cells and repair-related circuit units such as a plurality of repair word lines (not illustrated) and a plurality of fuse sets (not illustrated).

The core block 102 is configured to refresh memory cells in response to a refresh period signal REF, a row access strobe signal IRAS<0:7>, a row active signal RACTV<0:7>, and a refresh address RA<0:15>.

The refresh control circuit 100 may comprise a refresh timing control unit 101, an address control unit 200, a bank control unit 300, a refresh idle signal generating unit 400, and an address switching unit 500.

The refresh timing control unit 101 is configured to generate refresh timing signals for determining the timing of a refresh operation in response to an external refresh command AFACT.

The refresh timing signals may comprise a refresh period signal REF, a burst refresh period signal REFI, a refresh idle signals REF_IDLE, an idle signal IDLE, an internal refresh command FACT<0:3>, a row access strobe signal IRAS<0:7>, and a precharge signal PRE<0:7>.

The refresh timing control unit 101 may include a plurality of logic circuit units 110 to 170.

The logic circuit units 120 to 170 may be configured in the same manner as the logic circuit units 12 to 17 of FIG. 1.

The address control unit 200 is configured to generate a refresh address RA<0:15> in response to the burst refresh period signal REFI.

The address control unit 200 includes a plurality of logic circuit units 210 to 240.

The logic circuit units 210, 220 and 240 may be configured in the same manner as the logic circuit units 21, 22 and 23 of FIG. 1.

The logic circuit unit 230 is configured to interrupt the original refresh address RA<13:14> in response to the burst refresh period signal REFI and output a count signal REFCNT<0:1> as the refresh address RA<13:14>

The bank control unit 300 is configured to generate a row active signal RACTV<0:7> in response to the internal refresh command FACT<0:3> and the precharge signal PRE<0:7>.

The refresh idle signal generating unit 400 is configured to generate the refresh idle signal REF_IDLE in response to the idle signal IDLE.

The refresh idle signal generating unit 400 is configured to delay a rising edge of the idle signal IDLE and generate the refresh idle signal REF_IDLE.

The address switching unit 500 is configured to output a refresh count reset signal RCNTRST and a count signal REFCNT<0:1> in response to the burst refresh period signal REFI and a refresh mode setting signal T2REF.

Figure 5:
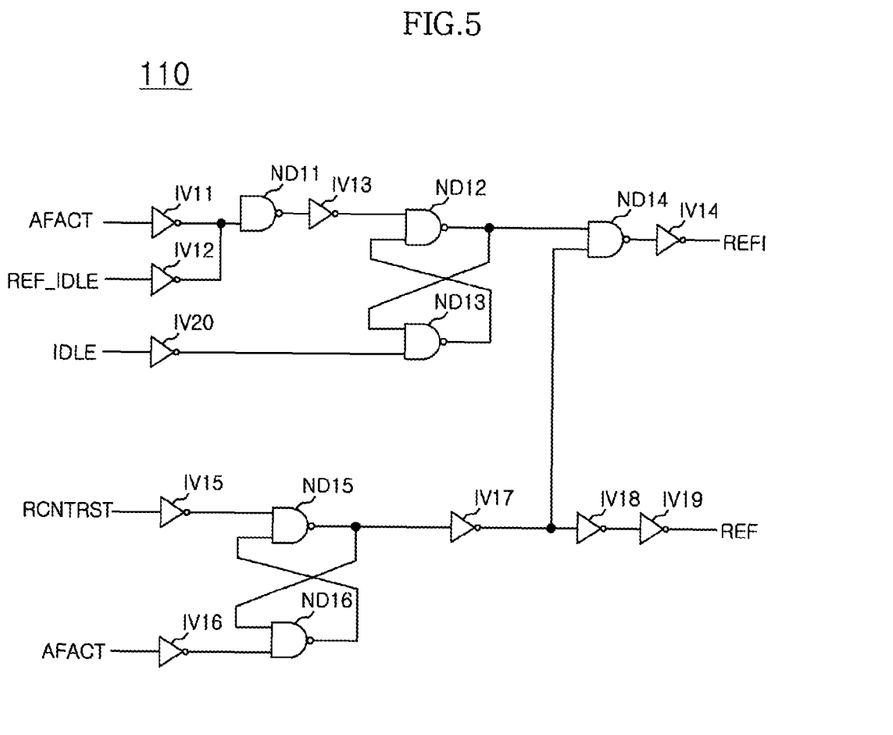
FIG. 5 is a circuit diagram of a logic circuit unit illustrated in FIG. 4.

FIG. 5 is a circuit diagram of the first logic circuit unit 110 is illustrated in FIG. 4.

Referring to FIG. 5, the first logic circuit unit 110 comprises a plurality of inverters IV11 to IV19 and a plurality of NAND gates ND11 to ND16.

The first logic circuit unit 110 sets the refresh period signal REF to a logical high level in response to the external refresh command AFACT, and resets the refresh period signal REF to a logical low level in response to an idle signal IDLE.

The first logic circuit unit 110 resets the refresh period signal REF to a logical low level in response to the refresh count reset signal RCNTRST.

When the refresh period signal REF is at a logical high level, the first logic circuit unit 110 sets the burst refresh period signal REFI to a logical high level in response to the external refresh command AFACT or the refresh idle signal REF_IDLE.

The logic circuit 110 resets the burst refresh period signal REFI to a logical low level in response to the idle signal IDLE.

Figure 6:
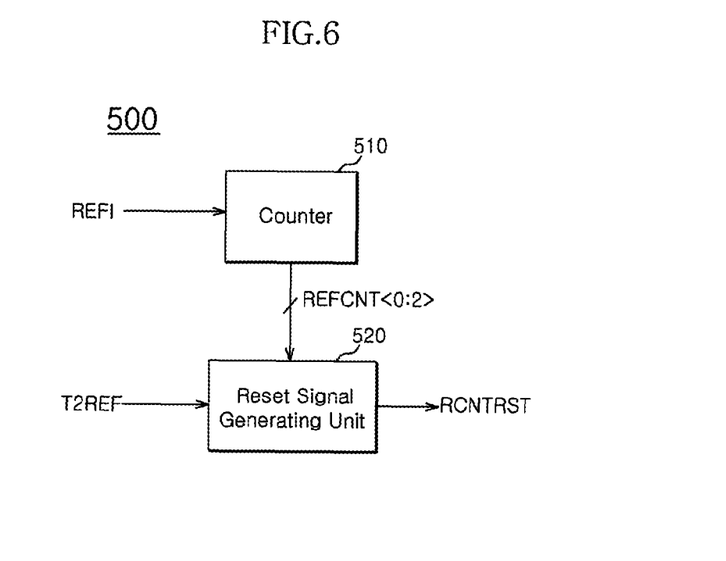
FIG. 6 is a block diagram of an address switching unit illustrated in FIG. 4.

FIG. 6 is a block diagram of the address switching unit 500 illustrated in FIG. 4.

Referring to FIG. 6, the address switching unit 500 comprises a counter 510 and a reset signal generating unit 520.

The counter 510 is configured to generate a counter signal REFCNT<0:2> in response to the burst refresh period signal REFI.

The reset signal generating unit 520 is configured to generate the refresh count reset signal RCNTRST in response to the is count signal REFCNT<0:2> and the refresh mode setting signal T2REF.

The refresh mode setting signal T2REF is used to define a refresh count. That is, the refresh mode setting signal T2REF is used to determine whether the memory apparatus 2 performs a refresh operation four or two times during a refresh row cycle time (tRFC).

The refresh count reset signal RCNTRST is used to deactivate the burst refresh period signal REFI and the refresh period signal REF.

Figure 7:
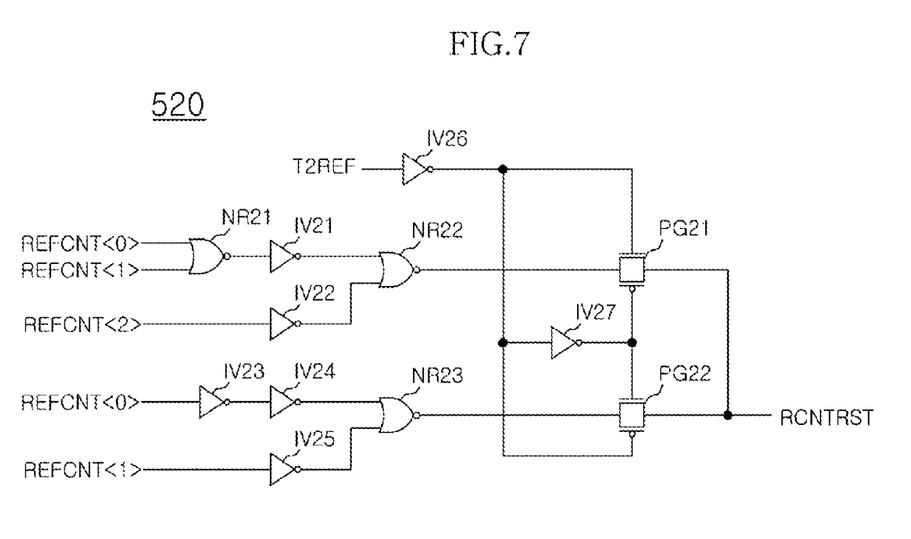
FIG. 7 is a circuit diagram of a reset signal generating unit illustrated in FIG. 6.

FIG. 7 is a circuit diagram of the reset signal generating unit 520 illustrated in FIG. 6.

Referring to FIG. 7, the reset signal generating unit 520 may include a plurality of inverters IV21 to IV27, a plurality of NOR gates NR21 to NR23, and a plurality of pass gates PG21 and PG22.

When the refresh mode setting signal T2REF is at a logical high level, a refresh operation is performed two times during a refresh row cycle time (tRFC); and when the refresh mode setting signal T2REF is at a logical low level, a refresh operation is performed four times during a refresh row cycle time (tRFC).

A refresh operation is performed four times when the refresh mode setting signal T2REF is at a logical low level. Therefore, when the count signal REFCNT<0:2> is a decimal number '4', that is, a binary number '100', the burst refresh period signal REFI and the refresh period signal REF are deactivated.

A refresh operation is performed two times when the refresh is mode setting signal T2REF is at a logical high level. Therefore, when the count signal REFCNT<0:1> is a decimal number '2', that is, a binary number '10', the burst refresh period signal REFI and the refresh period signal REF are deactivated.

Thus, if the refresh mode setting signal T2REF is at a logical high level, and when the count signal REFCNT<0:1> is '10', the reset signal generating unit 520 activates the refresh count reset signal RCNTRST.

If the refresh mode setting signal T2REF is at a logical low level, and when the count signal REFCNT<0:2> is '001', the reset signal generating unit 520 activates the refresh count reset signal RCNTRST.

Figure 8:
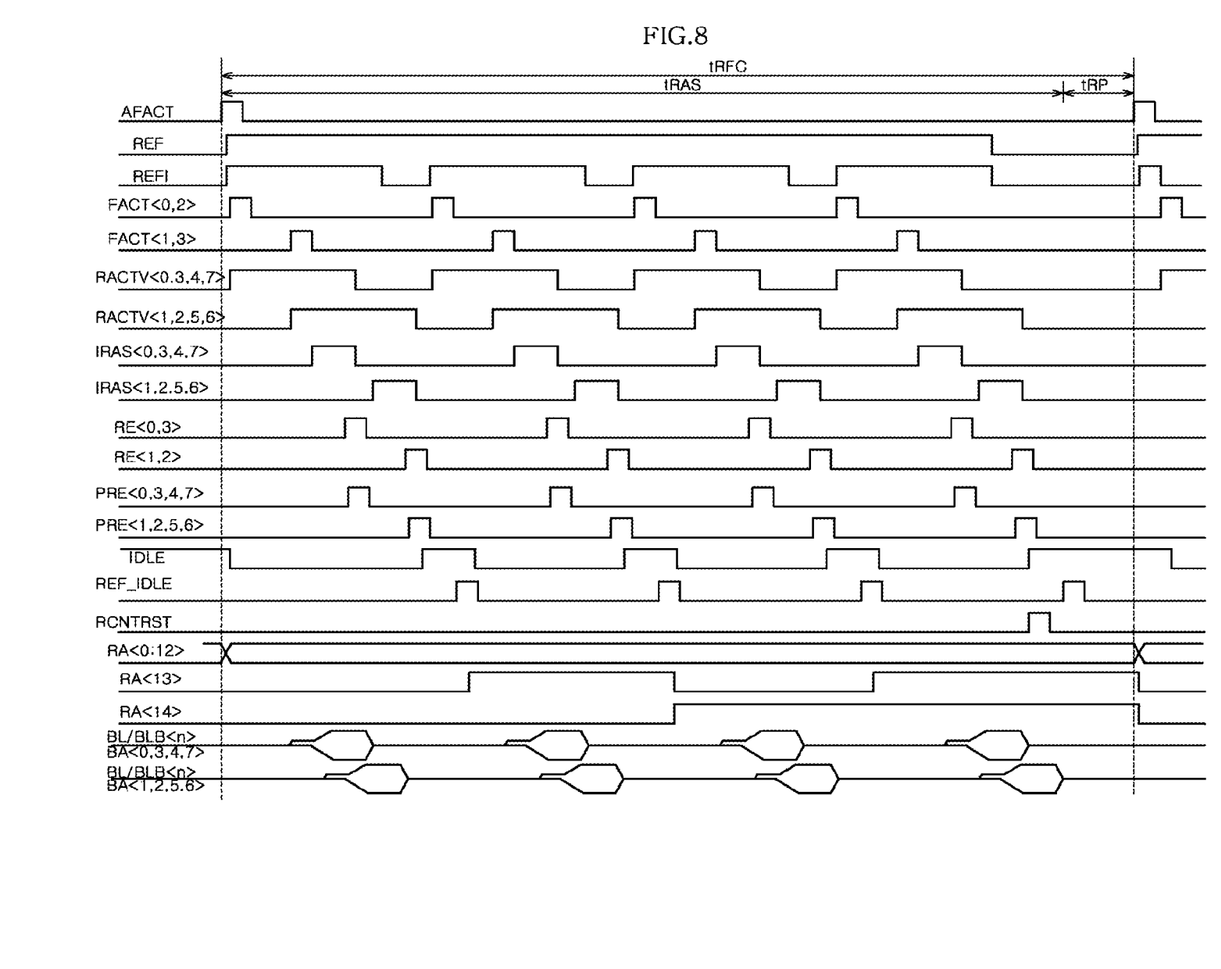
FIGS. 8 to 10 are operation timing diagrams of refresh control methods according to exemplary embodiments.
Figure 9:
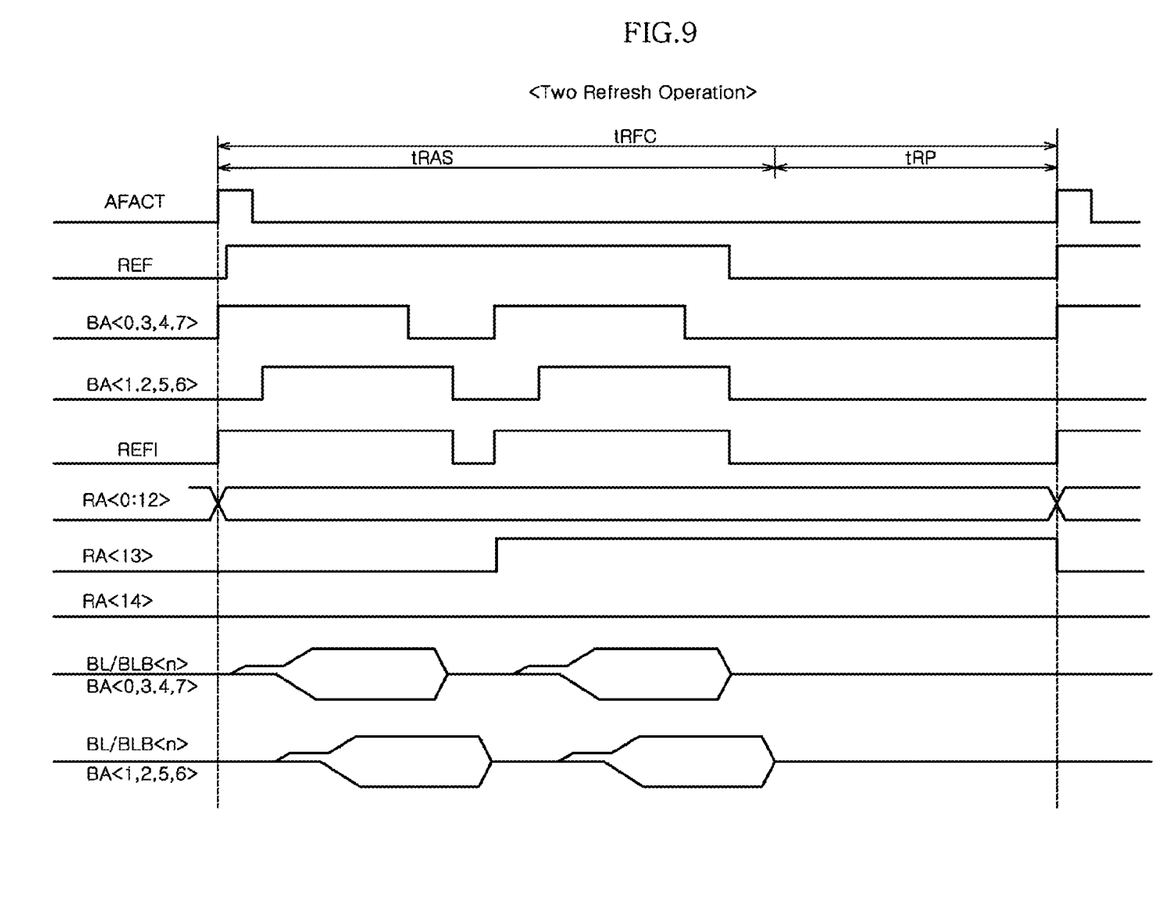
Figure 10:
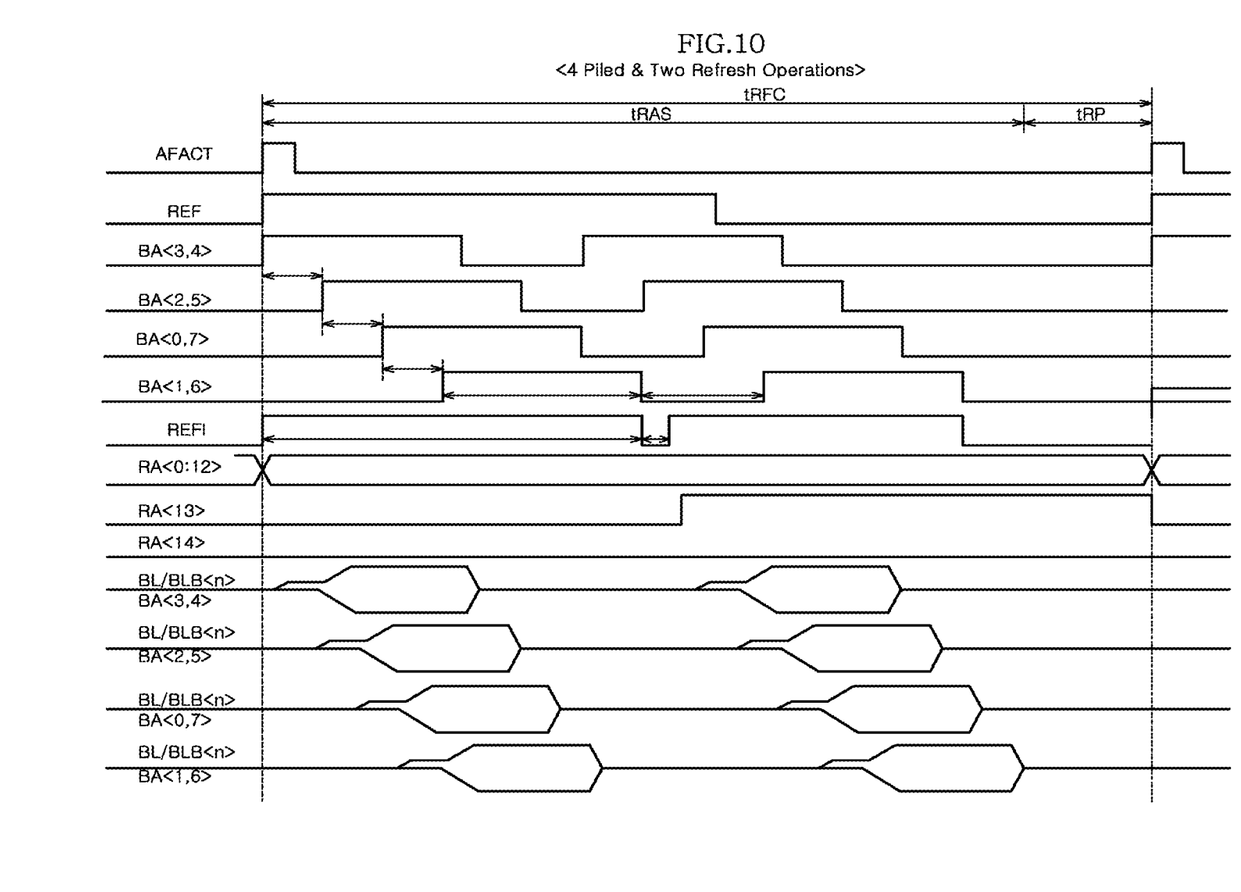

FIGS. 8 to 10 are operation timing diagrams of refresh control methods according to exemplary embodiments of the present invention.

A refresh control method according to an exemplary embodiment of the present invention will be described below with reference to FIG. 8.

Referring to FIG. 8, the first logic circuit unit 110 generates the refresh period signal REF and the burst refresh period signal REFI in response to the external refresh command AFACT, the refresh count reset signal RCNTRST, the refresh idle signal REF_IDLE and the idle signal IDLE.

The second logic circuit unit (CLREF) 120 generates the internal refresh command FACT<0:3> in response to the burst is refresh period signal REFI.

The third logic circuit unit (PILED_DLY) 130 delays an output signal REFBA of the second logic circuit unit 120 and generates a delay signal REFBAD.

The bank control unit 300 activates the row active signal RACTV<0:7> in response to the internal refresh command FACT<0:3>.

The fourth logic circuit unit 140 generates the idle signal IDLE by NORing the row active signal RACTV<0:7>.

The refresh idle signal generating unit 400 delays a rising edge of the idle signal IDLE and generates the refresh idle signal REF_IDLE.

The fifth logic circuit unit 150 generates the row access strobe signal IRAS<0:7> in response to the row active signal RACTV<0:7>.

The sixth logic circuit unit 160 generates a preliminary precharge signal RE<0:3> in response to the row access strobe signal IRAS<0:7> and the burst refresh period signal REFI.

The seventh logic circuit unit 170 generates the precharge signal PRE<0:7> in response to the external refresh command AFACT and the preliminary precharge signal RE<0:3>.

The bank control unit 300 deactivates the row active signal RACTV<0:7> in response to the precharge signal PRE<0:7>.

The address control unit 200 interrupts the external refresh address RA<13:14> in response to the burst refresh period signal REFI, and outputs the count signal REFCNT<0:1> as the refresh address RA<13:14>.

Herein, the count signal REFCNT<0:1>, that is, the refresh address RA<13:14> changes into different values '00', '10', '01', '11' for the respective activation periods of the burst refresh period signal REFI.

Thus, the word lines of the memory banks BA<0, 3, 4, 7> of the core block 102 corresponding to the refresh addresses RA<13:14> having values of '00', '10', '01', '11' are sequentially activated, and a charge sharing operation of a bit/bit-bar line BL/BLB<n> is performed accordingly.

The memory banks BA<1, 2, 5, 6> of the core block 102 may perform a charge sharing operation in the same manner as the memory banks BA<0, 3, 4, 7>.

FIG. 8 illustrates a case where a refresh operation is performed four times during a refresh row cycle time (tRFC) when the refresh mode setting signal T2REF is at a logical low level.

Thereafter, the refresh count reset signal RCNTRST is generated when the count signal REFCNT<0:2> has a value of '100'.

The refresh period signal REF and the burst refresh period signal REFI are deactivated in response to the refresh count reset signal RCNTRST.

FIG. 9 illustrates a case where a refresh operation is performed two times during a refresh row cycle time (tRFC) when the refresh mode setting signal T2REF is at a logical high level.

Referring to FIG. 9, the word lines of the memory banks BA<0, 3, 4, 7> of the core block 102 corresponding to the refresh addresses RA<13:14> having values of '00', '10' are sequentially activated, and a charge sharing operation of a bit/bit-bar line BL/BLB<n> is performed accordingly.

The memory banks BA<1, 2, 5, 6> of the core block 102 may perform a charge sharing operation in the same manner as the memory banks BA<0, 3, 4, 7>.

Thereafter, the refresh count reset signal RCNTRST is generated when the count signal REFCNT<0:1> has a value of '10'.

The refresh period signal REF and the burst refresh period signal REFI are deactivated in response to the refresh count reset signal RCNTRST.

Meanwhile, a piled refresh operation may be performed to reduce the maximum current value by changing the activation timing of each memory bank by one external refresh command AFACT.

A piled refresh operation is applied to the memory banks BA<3:4>, BA<2:5>, BA<0:7> and BA<1:6> as illustrated in FIG. 10, and a refresh operation is performed two times during a refresh row cycle time (tRFC) as illustrated in FIG. 9.

As described above, exemplary aspects of the present invention perform a plurality of refresh operations during a refresh row cycle time (tRFC) in response to one refresh command while changing an address, thus making it possible to reduce an increase in an area of repair-related circuits caused by an increase in the storage is capacity of the memory apparatus.

While certain embodiments have been described above, it will be understood to those skilled in the art that the embodiments described are by way of example only. Accordingly, the refresh control circuit, the memory apparatus and the refresh control method using the same, described herein, should not be limited based on the described embodiments. Rather, the refresh control circuit, the memory apparatus and the refresh control method using the same, described herein, should only be limited in light of the claims that follow when taken in conjunction with the above description and accompanying drawings.

What is claimed is:

1. A refresh control circuit comprising:
   a refresh timing control unit configured to generate a burst refresh period signal, an internal refresh command, and a precharge signal in response to a refresh command;
   a bank control unit configured to generate a row active signal in response to the internal refresh command and the precharge signal;
   an address control unit configured to output a count signal as refresh addresses in response to the burst refresh period signal; and
   an address switching unit configured to generate the count signal in response to the burst refresh period signal,
   wherein the row active signal has a plurality of activation periods per memory bank within a row cycle time (tRFC).

2. The refresh control circuit according to claim 1, wherein the refresh addresses have different values corresponding to a plurality of activation periods.

3. The refresh control circuit according to claim 1, wherein the address control unit is configured to output the count signal, instead of an external address, as refresh addresses in response to the burst refresh period signal.

4. The refresh control circuit according to claim 1, wherein the address switching unit is configured to generate a refresh count reset signal in response to the count signal.

5. The refresh control circuit according to claim 4, wherein the address switching unit is configured to activate the refresh count reset signal when a value of the count signal is equal to a predetermined value.

6. The refresh control circuit according to claim 4, wherein the refresh timing control unit is configured to deactivate the burst refresh period signal in response to the refresh count reset signal.

7. A memory apparatus configured to generate refresh address sets with different values per memory bank in response to one refresh command and an address, and perform a plurality of refresh operations with a time differences in response to the refresh address sets, wherein the refresh operations are performed within a refresh row cycle time (tRFC).

8. The memory apparatus according to claim 7, wherein the number of the refresh operations is controlled in response to an external signal.

9. The memory apparatus according to claim 7, comprising:
- a core block configured to perform a refresh operation in response to the refresh address sets and a row active signal; and
- a repair control circuit configured to generate the row active signal with a plurality of activation periods within a refresh row cycle time (tRFC) in response to a refresh command and generate the refresh address sets with different values corresponding to the activation periods.

10. The memory apparatus according to claim 9, wherein the core block comprises:
- a plurality of memory cells; and
- a plurality of repair word lines and a plurality of fuse sets configured to perform a repair operation on the memory cells.

11. The memory apparatus according to claim 9, wherein the repair control circuit comprises:
- a refresh timing control unit configured to generate a burst refresh period signal, an internal refresh command, and a precharge signal in response to the refresh command;
- a bank control unit configured to generate the row active signal in response to the internal refresh command and the precharge signal;
- an address control unit configured to output a count signal as refresh address sets in response to the burst refresh period signal; and
- an address switching unit configured to generate the count signal in response to the burst refresh period signal.

12. The memory apparatus according to claim 11, wherein the address control unit is configured to output the count signal, instead of an external address, as refresh address sets in response to the burst refresh period signal.

13. The memory apparatus according to claim 11, wherein the address switching unit is configured to generate a refresh count reset signal in response to the count signal.

14. The memory apparatus according to claim 13, wherein the address switching unit is configured to activate the refresh count reset signal when a value of the count signal is equal to a predetermined value.

15. The memory apparatus according to claim 13, wherein the address switching unit is configured to activate the refresh count reset signal in response to an external signal when a value of the count signal is equal to a first predetermined value or a second predetermined value.

16. The memory apparatus according to claim 15, wherein the external signal is used to set the count of the refresh operations.

17. The memory apparatus according to claim 13, wherein the refresh timing control unit is configured to deactivate the burst refresh period signal in response to the refresh count reset signal.

18. A refresh control method of a memory apparatus, comprising:
- receiving a refresh command;
- generating a row active signal with a plurality of activation periods per memory bank within a refresh row cycle time (tRFC) in response to the refresh command; and
- performing a refresh operation in response to the row active signal.

19. The refresh control method according to claim 18, wherein, receiving the refresh command comprises receiving one refresh command.

20. The refresh control method according to claim 18, further comprising, generating a refresh address with different values corresponding respectively to the plurality of activation periods.

21. The refresh control method according to claim 18, wherein performing the refresh operation comprises performing a plurality of refresh operations with time differences in response to the row active signal.

22. The refresh control method according to claim 20, wherein generating the refresh address comprises:
- generating a count signal corresponding to each of the plurality of activation periods; and
- outputting the count signal as the refresh address.

23. The refresh control method according to claim 22, wherein performing the refresh operation comprises changing the count of the refresh operation by resetting the count signal in response to a count value of the count signal.

* * * * *